United States Patent
Varghese et al.

(10) Patent No.: US 7,723,173 B2
(45) Date of Patent: May 25, 2010

(54) LOW TEMPERATURE POLYSILICON OXIDE PROCESS FOR HIGH-K DIELECTRIC/METAL GATE STACK

(75) Inventors: Ajith Varghese, McKinney, TX (US); James J. Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/400,253

(22) Filed: Mar. 9, 2009

(65) Prior Publication Data
US 2009/0170346 A1 Jul. 2, 2009

Related U.S. Application Data

(62) Division of application No. 11/697,993, filed on Apr. 9, 2007, now abandoned.

(51) Int. Cl.
*H01L 21/8238* (2006.01)
(52) U.S. Cl. .................. 438/216; 438/287; 438/591; 257/E21.301; 257/E21.302
(58) Field of Classification Search .............. None
See application file for complete search history.

(56) References Cited
U.S. PATENT DOCUMENTS

| | | | |
|---|---|---|---|
| 5,330,935 A * | 7/1994 | Dobuzinsky et al. ........ 438/767 |
| 5,880,029 A | 3/1999 | Eisenbeiser et al. | |
| 6,248,618 B1 | 6/2001 | Quek et al. | |
| 6,346,734 B2 * | 2/2002 | Divakaruni et al. ......... 257/413 |
| 6,723,608 B2 * | 4/2004 | Hayakawa .................. 438/299 |
| 2004/0046219 A1 * | 3/2004 | Ueno et al. ................. 257/412 |
| 2005/0101145 A1 * | 5/2005 | Visokay et al. .............. 438/706 |

OTHER PUBLICATIONS

"Electrical Characteristics of High-Quality Sub-25-[angst] Oxides Grown by Ultraviolet Ozone Exposure at Low Temperature;" Electron Device Letters, Mar. 1999, pp. 132-134, G. D. Wilk and B. Brar.

* cited by examiner

*Primary Examiner*—W. David Coleman
*Assistant Examiner*—Shaka Scarlett
(74) *Attorney, Agent, or Firm*—Warren L. Franz; Wade J. Brady, III; Frederick J. Telecky, Jr.

(57) ABSTRACT

A method for preventing oxidation in a high-k dielectric/metal gate stack in the manufacture of an integrated circuit device is disclosed. In a detailed embodiment, a PMOS region stack has nitrided hafnium silicide, tungsten, tantalum nitride and polysilicon layers. An NMOS region stack has nitrided hafnium silicide, tungsten silicide, tantalum nitride and polysilicon layers. A thin polysilicon layer deposited over the stacks is converted to an oxide using a low temperature ultraviolet ozone oxidation process or a plasma nitridation using decoupled plasma nitridation or $NH_3$ annealing. The oxide provides a coating over the top and sides of the stacks to protect metal and interfaces from oxidation.

20 Claims, 2 Drawing Sheets

LOW TEMPERATURE POLYSILICON OXIDE PROCESS FOR HIGH-K DIELECTRIC/METAL GATE STACK

CROSS-REFERENCE TO RELATED APPLICATIONS

This is a division of application Ser. No. 11/697,993, filed Apr. 9, 2007, the entirety of which is incorporated herein by reference.

FIELD OF THE INVENTION

This relates to methods of manufacturing an integrated circuit; and, more particularly, to a method of manufacturing an integrated circuit that is protected from oxidation.

BACKGROUND OF THE INVENTION

Background

Presently within the semiconductor industry, a trend exists to manufacture integrated circuits (ICs) with a greater number of layers and with higher device densities. To achieve these high densities, the thickness of the layers is increasingly being reduced, the uniformity of layers is being improved, the thickness of devices is being improved, and device dimensions (e.g., at submicron levels) on semiconductor wafers are being reduced. Higher device packing density requires a reduction of a thickness of gate oxide materials (e.g., silicon dioxide $SiO_2$), a reduction of a width and spacing of interconnecting lines, a reduction of a spacing and diameter of contact holes, and a reduction of a surface geometry such as corners and edges of various features. Reduction of the size of integrated circuit allows the integrated circuits to operate at higher frequencies. Moreover, a reduction of the size of integrated circuits allows more integrated circuits to be manufactured on a single wafer.

At present, a typical process to create an integrated circuit requires forming several layers on a substrate. For a metal-oxide-semiconductor (MOS) transistor, for example, a gate structure is created, which can be energized to establish an electric field within a semiconductor channel, by which current is enabled to flow between a source region and a drain region within the transistor. The source and drain regions comprise a majority of p or n type materials that facilitate this conductance. The p or n type materials are formed by adding dopants to targeted areas on either side of a channel region in a semiconductor substrate. The gate structure is comprised of a gate dielectric and a contact or gate electrode. The gate contact generally includes metal or doped polysilicon, and is formed over the gate dielectric which is itself formed over the channel region. The gate dielectric is an insulator material, which prevents large currents from flowing from the gate electrode into the channel when a voltage is applied to the gate contact, while allowing an applied gate voltage to set up an electric field within the channel region in a controllable manner.

The size of the transistors and other electrical components on an integrated circuit is continually decreasing to improve device density. However, certain properties of the materials utilized to form the transistors limit the size to which the transistors can be reduced. By way of example, properties of silicon dioxide, which is commonly used to form the layer comprising the gate dielectric in transistors, can limit the degree to which the thickness of the gate dielectric can be reduced. For instance, extremely thin silicon dioxide layers allow for significant gate leakage currents due to direct tunneling of charge carriers through the oxide. Thus, it has been found that operating parameters may change dramatically due to slight variations in gate dielectric thickness.

Furthermore, thin gate dielectric layers are known to provide poor diffusion barriers to impurities. Extremely thin silicon dioxide gate dielectric layers suffer from high boron penetration into the underlying channel region during doping of the source/drain regions. Recent efforts at device scaling have focused on alternative dielectric materials that can be formed in a thicker layer than silicon dioxide layers and yet still produce the same field effect performance. These materials are often referred to as "high-k dielectric" materials because their dielectric constants are greater than that of silicon dioxide. The relative performance of such high-k dielectric materials is often expressed as equivalent oxide thickness because the alternative material layer may be thicker, while providing the equivalent electrical effect of a much thinner layer of silicon dioxide. Accordingly, high-k dielectric materials can be utilized to form gate dielectrics, and the high-k dielectric materials facilitate a reduction in device dimensions while maintaining a consistency of desired device performance.

The alternative dielectric materials formed in a thicker layer make the stack susceptible to residual oxidation at the interface surfaces, particularly during polysilicon oxidation when the edges are exposed. The susceptibility of the stack to residual oxidation eliminates the use of conventional high temperature polysilicon oxidation process for high-k dielectric/metal gate devices.

FIG. 5 shows a conventional high-k dielectric/metal gate transistor and the areas susceptible to metal oxidation or oxidation at various interfaces of the high-k dielectric/metal gate stack.

In particular, an example conventional high-k dielectric/metal gate transistor 500 is comprised of a PMOS region 510, an NMOS region 520, a shallow trench isolation region 530, a first gate stack 540 and a second gate stack 550. The first gate stack 540 is comprised of a polysilicon layer 541, a tantalum nitride (TaN) layer 542, a tungsten (W) layer 543 and a nitrided hafnium-silicate (HfSiON) layer 544. The second gate stack is comprised of a polysilicon layer 551, a TaN layer 552, a tungsten silicide ($WSi_2$) layer 553 and a HfSiON layer 554.

Areas susceptible for metal oxidation on the first gate stack 540 and the second gate stack 550 are shown respectively as susceptible area 560 and susceptible area 570.

A solution that has been proposed to remedy the oxidation of metal or oxidation at various interfaces of the high-k dielectric/metal gate stack is the use of a low temperature deposited oxide, such as a polysilicon oxide. However, the low temperature deposited oxide is of a very low quality and is susceptible to pinhole issues. Pinholes make the underlying dielectric/metal gate stack susceptible to subsequent cleans and high temperature processes.

Accordingly, the present invention solves these and other problems of the prior art associated with issues of oxidation of metal or oxidation at various interfaces of high-k dielectric/metal gate stack.

SUMMARY

In accordance with the invention, a transistor is disclosed including a stack of at least one of a high-k dielectric gate layer and a metal gate layer. A polysilicon oxide coating is used over the stack to prevent oxidation of the at least one of the high-k dielectric layer and the metal gate layer. The polysilicon oxide coating is formed from a polysilicon coating over the stack.

In accordance with the invention, an integrated circuit device is disclosed including a feature that is susceptible to oxidation. A polysilicon oxide coating is used over the feature susceptible to oxidation to protect the feature susceptible to oxidation from oxidizing. The polysilicon oxide coating is formed from a polysilicon coating over the stack.

In accordance with the invention, a method of preventing oxidation within an integrated circuit device is disclosed as including the steps of forming the integrated circuit device, depositing a thin layer of a first material over the integrated circuit device, and converting the first material to a second material to prevent oxidation within the integrated circuit device.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are illustrative and explanatory only and are not restrictive of the invention, as claimed.

The accompanying drawings, which are incorporated in and constitute a part of this specification, illustrate embodiments of the invention and together with the description, serve to explain the principles of the invention.

DETAILED DESCRIPTION OF EXAMPLE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
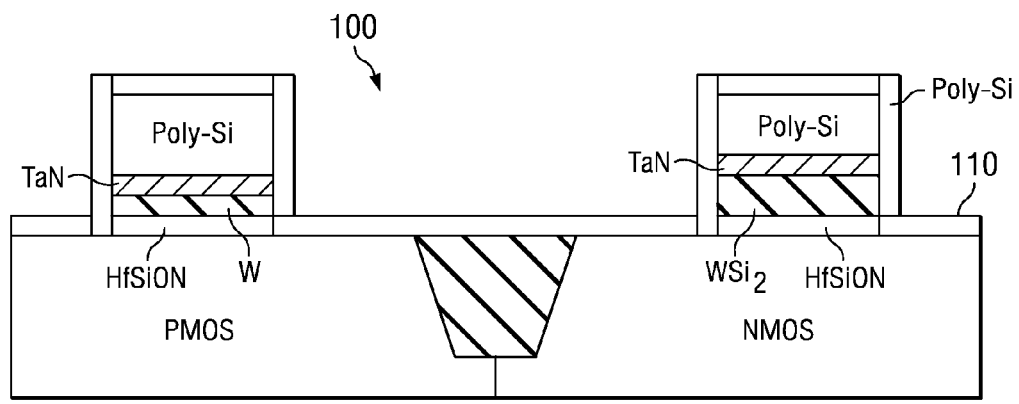
FIG. 1 shows a transistor including layers after a first step of a process by which to obtain a high quality low temperature polysilicon oxide for a high-k dielectric/metal gate has been performed on the transistor, in accordance with various embodiments of the present teachings.

FIG. 1 shows a transistor including layers after a first step of a process by which to obtain a high quality low temperature polysilicon oxide for a high-k dielectric/metal gate has been performed on the transistor, in accordance with various embodiments of the present teachings.

Figure 5:
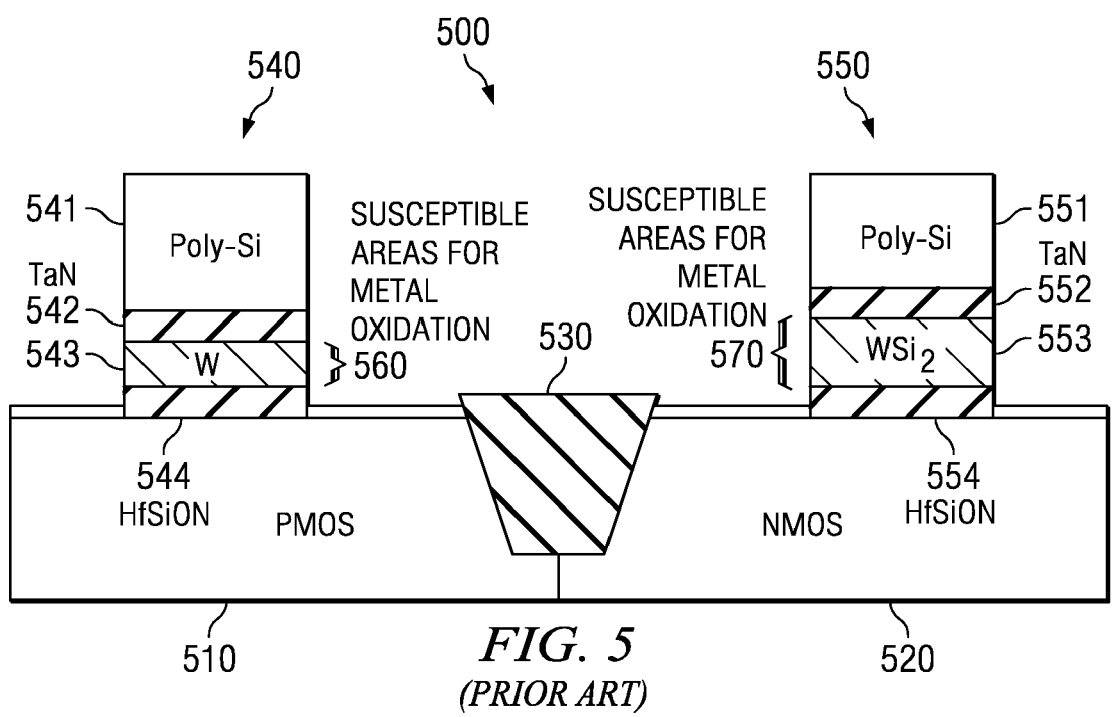
FIG. 5 shows a conventional high-k dielectric/metal gate transistor and the areas susceptible to metal oxidation or oxidation at various interfaces of the high-k dielectric/metal gate stack.

In particular, an example high-k dielectric/metal gate transistor 100 is constructed with a similar structure to that shown in the prior art of FIG. 5. However, to prevent oxidation of metal or oxidation at various interfaces of a high-k dielectric/metal gate stack a very thin layer of polysilicon coating 110 is deposited on top of the high-k dielectric/metal gate stack after a gate etch clean is performed. An example thickness of the polysilicon layer that is deposited on the high-k dielectric/metal gate stack is approximately 50 Å.

Figure 2:
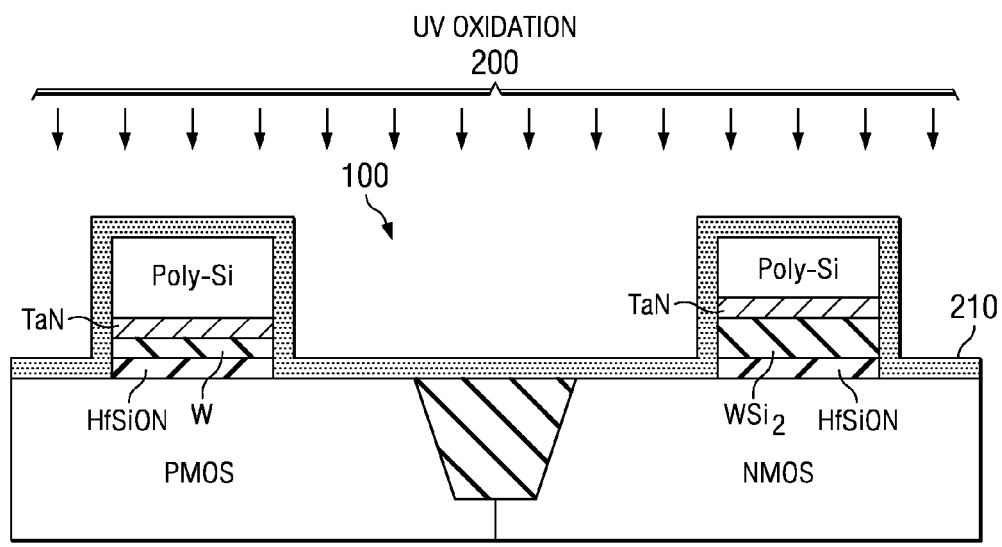
FIG. 2 shows a transistor including layers after a second step of a process by which to obtain a high quality low temperature polysilicon oxide for a high-k dielectric/metal gate is performed on the transistor, in accordance with various embodiments of the present teachings.

FIG. 2 shows a transistor including layers after a second step of a process by which to obtain a high quality low temperature polysilicon oxide for a high-k dielectric/metal gate is performed on the transistor, in accordance with various embodiments of the present teachings.

In particular, the example high-k dielectric/metal gate transistor 100 including the very thin layer of polysilicon coating 110, shown in FIG. 1, is subjected to an ultraviolet ozone ($O_3$) low temperature (e.g., 25-600° C.) oxidation 200. The ultraviolet ozone low temperature oxidation 200 transforms the very thin layer of polysilicon 110 into a very uniform good quality polysilicon oxide coating 210 all around the high-k dielectric/metal gate stack. The uniformity from the disclosed process produced is in the example range of 15-25 Å.

Thus, the very uniform good quality polysilicon oxide coating 210 produced with the ultraviolet ozone low temperature oxidation 200 results in a protective coating for the high-k dielectric/metal gate stack. The very uniform good quality polysilicon oxide coating 210 prevents areas susceptible to metal oxidation, such as those areas shown in FIG. 5 in the prior art, from being oxidized. The very uniform good quality polysilicon oxide coating 210 eliminates the oxidation of metal or oxidation at various interfaces of a high-k dielectric/metal gate stack associated with the prior art.

Figure 3:
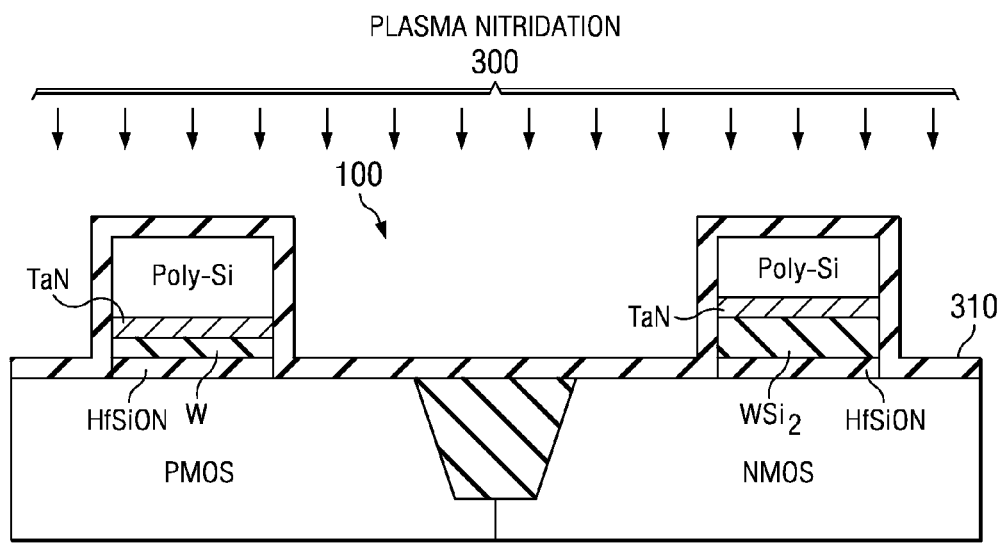
FIG. 3 shows an alternative transistor including layers after an alternative process by which to obtain a polysilicon oxide for a high-k dielectric/metal gate, in accordance with various embodiments of the present teachings.

FIG. 3 shows an alternative transistor including layers after an alternative process by which to obtain a polysilicon oxide coating for a high-k dielectric/metal gate, in accordance with various embodiments of the present teachings.

In particular, an example high-k dielectric/metal gate transistor 100 is constructed with a similar structure to that shown in the prior art of FIG. 5. The alternative process by which to obtain a polysilicon oxide coating for a high-k dielectric/metal gate of FIG. 3 begins with a same first step as disclosed in FIG. 1. However, instead of subjecting the very thin layer of polysilicon coating to ultraviolet oxidation, e.g., ultraviolet ozone low temperature oxidation, as disclosed in FIG. 2, plasma nitridation 300 is employed to form a very thin layer of SiON based polysilicon oxide coating 310 on top of the high-k dielectric/metal gate stack.

Thus, the very uniform good quality SiON based polysilicon oxide coating 310 produced with plasma nitridation, e.g., decoupled plasma nitridation (DPN) or $NH_3$ annealing, results in a protective coating for the high-k dielectric/metal gate stack similar to the protective coating produced by process described for FIGS. 1 and 2. The very uniform good quality SiON based polysilicon oxide coating 310 prevents areas susceptible to metal oxidation, such as those areas shown in FIG. 5 in the prior art, from being oxidized. The very uniform good quality SiON based polysilicon oxide coating 310 eliminates the oxidation of metal or oxidation at various interfaces of a high-k dielectric/metal gate stack associated with the prior art.

Although FIGS. 1-3 disclose a transistor having a particular structure, the structure of the disclosed transistor is irrelevant to the present teachings. Any transistor that is susceptible to oxidation can benefit from the disclosed process of forming a polysilicon oxide coating to prevent oxidation.

Figure 4:
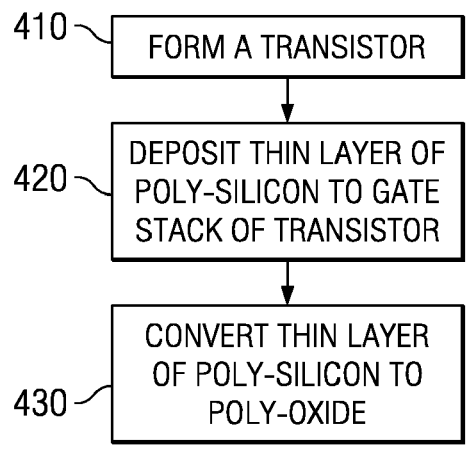
FIG. 4 shows a process by which a transistor is protected from oxidation of metal or oxidation at various interfaces of a high-k dielectric/metal gate stack, in accordance with various embodiments of the present teachings.

FIG. 4 shows a process by which a transistor is protected from oxidation of metal or oxidation at various interfaces of a high-k dielectric/metal gate stack, in accordance with various embodiments of the present teachings.

The first step of the process 410 comprises formation of a transistor, as is disclosed within the prior art.

The second step of the process 420 includes formation of the very thin layer of polysilicon coating on the high-k dielectric/metal gate stack.

The third step of the process 430 includes conversion of the very thin layer of polysilicon coating on the high-k dielectric/metal gate stack to a polysilicon oxide protective coating.

While the teachings have been illustrated with respect to preventing oxidation within a gate stack of a transistor, the principles disclosed herein can be applied to any integrated circuit that is susceptible to oxidation. Moreover, while particular processes are disclosed herein to produce a polysilicon oxide coating over an integrated circuit device, the principles disclosed herein apply to any process that converts a first coating into a second protective coating over an integrated circuit device.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as illustrative only, with a true scope and spirit of the invention being indicated by the following claims.

What is claimed is:

1. A method for preventing oxidation of a gate stack in the manufacture of an integrated circuit device, comprising:
   forming at least one gate stack comprising a high-k dielectric layer formed over a substrate; and a metal layer formed over the high-k dielectric layer; and
   depositing a layer of polysilicon of no more than approximately 50 Å thickness over the at least one gate stack; and
   converting the layer of polysilicon to an oxide by a plasma nitridation or an ultraviolet ozone oxidation process at a temperature of 25 to 600° C.;
   whereby the resulting oxide provides a uniform coating over the top and sides of the gate stack to protect metal and interfaces of the stack from oxidation.

2. The method of claim 1, wherein the layer of polysilicon is deposited after a gate etch clean is performed.

3. The method of claim 1, wherein the oxide coating has a uniformity in the range of 15-25 Å.

4. The method of claim 1, wherein the plasma nitridation comprises decoupled plasma nitridation or $NH_3$ anneal.

5. A method for preventing oxidation of a gate stack in the manufacture of an integrated circuit device, comprising:
   forming isolated adjacent PMOS and NMOS regions on a substrate;
   forming first and second gate stacks respectively over the PMOS and NMOS regions; the first and second gate stacks each comprising a high-k dielectric layer formed over the substrate and a metal layer formed over the high-k dielectric layer;
   depositing a thin layer of polysilicon over the first and second gate stacks; and
   converting the thin layer of polysilicon to an oxide by an ultraviolet ozone oxidation process at a temperature of 25 to 600° C.;
   whereby the oxide provides a coating over the top and sides of the gate stack to protect the metal and interfaces of the stack from oxidation.

6. The method of claim 5, wherein the thin layer of polysilicon is deposited after a gate etch clean is performed.

7. The method of claim 5, wherein the thin layer of polysilicon has a thickness of no more than approximately 50 Å.

8. The method of claim 5, wherein the oxide coating has a uniformity in the range of 15-25 Å.

9. A method for preventing oxidation of a gate stack in the manufacture of an integrated circuit device, comprising:
   forming isolated adjacent PMOS and NMOS regions on a substrate;
   forming first and second gate stacks respectively over the PMOS and NMOS regions;
      the first gate stack comprising a nitrided hafnium silicide layer formed over the substrate; a tungsten layer formed over the nitrided hafnium silicide layer; a tantalum nitride layer formed over the tungsten layer; and a polysilicon layer formed over the tantalum nitride layer; and
      the second gate stack comprising a nitrided hafnium silicide layer formed over the substrate, a tungsten silicide layer formed over the nitrided hafnium silicide layer; a tantalum nitride layer formed over the tungsten silicide layer; and a polysilicon layer formed over the tantalum nitride layer;
   depositing a layer of polysilicon of no more than approximately 50 Å thickness over the first and second gate stacks; and
   converting the layer of polysilicon to an oxide by an ultraviolet ozone oxidation process at a temperature of 25 to 600° C.;
   whereby the oxide provides a coating over the gate stack to protect metal and interfaces of the stack from oxidation.

10. The method of claim 9, wherein the coating is formed to completely cover the top and sides of the gate stack.

11. The method of claim 10, wherein the layer of polysilicon is deposited after a gate etch clean is performed.

12. The method of claim 11, wherein the oxide coating has a uniformity in the range of 15-25 Å.

13. The method of claim 1, wherein the gate stack further comprises a polysilicon layer formed over the metal layer.

14. The method of claim 13, wherein the metal layer comprises a layer comprising tungsten; and a tantalum nitride layer formed over the layer comprising tungsten.

15. The method of claim 14, wherein the layer comprising tungsten is tungsten or tungsten silicide.

16. The method of claim 15, wherein the high-k dielectric layer comprises a nitrided hafnium-silicate layer.

17. The method of claim 13, wherein the high-k dielectric layer comprises a nitrided hafnium-silicate layer.

18. A method for protecting gate stacks in the manufacture of an integrated circuit device, comprising:
   forming isolated adjacent PMOS and NMOS regions on a substrate;
   forming first and second gate stacks respectively over the PMOS and NMOS regions; wherein each gate stack comprises a high-k dielectric layer formed over the substrate, at least one metal layer formed over the high-k dielectric layer, and a polysilicon layer formed over the at least one metal layer; and
   depositing a layer of polysilicon of no more than approximately 50 Å thickness over the first and second gate stacks; and
   converting the layer of polysilicon to a dielectric by a plasma nitridation or an ultraviolet ozone oxidation process at a temperature of 25 to 600° C.;
   whereby the coverted polysilicon layer provides a coating over the gate stack to protect top and sides of the stack from oxidation.

19. The method of claim 18, wherein the high-k dielectric layer comprises nitrided hafnium silicide.

20. The method of claim 19, wherein the at least one metal layer comprises a layer of material comprising tantalum and a layer of material comprising tungsten.

* * * * *